United States Patent
Nakashima et al.

(10) Patent No.: US 7,311,772 B2
(45) Date of Patent: Dec. 25, 2007

(54) APPARATUS AND METHOD FOR SUPPLYING RAW MATERIAL IN CZOCHRALSKI METHOD

(75) Inventors: Katsunori Nakashima, Tokyo (JP); Koji Toma, Tokyo (JP); Manabu Moroishi, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/229,712

(22) Filed: Sep. 20, 2005

(65) Prior Publication Data

US 2006/0060133 A1 Mar. 23, 2006

(30) Foreign Application Priority Data

Sep. 21, 2004 (JP) ............................. 2004-273054

(51) Int. Cl.
 *C30B 15/20* (2006.01)
 *C30B 35/00* (2006.01)

(52) U.S. Cl. ........................... 117/18; 117/13; 117/208; 117/214

(58) Field of Classification Search .................. 117/13, 117/18, 208, 214
See application file for complete search history.

(56) References Cited

U.S. PATENT DOCUMENTS

| 6,277,192 B1 * | 8/2001 | Altekruger et al. ........... 117/18 |
| 6,805,746 B2 * | 10/2004 | Moroishi et al. ........... 117/214 |
| 7,001,456 B2 * | 2/2006 | Nakashima et al. .......... 117/33 |

FOREIGN PATENT DOCUMENTS

| JP | 09-208368 | 8/1997 |
| JP | 11-236290 | 8/1999 |
| WO | WO 02/068732 A1 | 9/2002 |

* cited by examiner

*Primary Examiner*—Felisa Hiteshew
(74) *Attorney, Agent, or Firm*—Clark & Brody

(57) ABSTRACT

Means for supplying raw material in additional charging or recharging of solid granular raw material into molten material in the crucible, comprises a raw material supply tube to be filled with said material, a metallic support member which runs through the inside of the tube, connects with the bottom lid, and serves for descending the lid and for ascending the tube and the lid, and a configuration avoiding metallic contamination, whereby the lower-end aperture of the tube is opened for charging said material therein into the crucible in uniform circumferential distribution and in large quantity, thus achieving efficient supply operation to be widely applied for growing silicon single crystals.

10 Claims, 5 Drawing Sheets

FIG. 4A
FIG. 4B
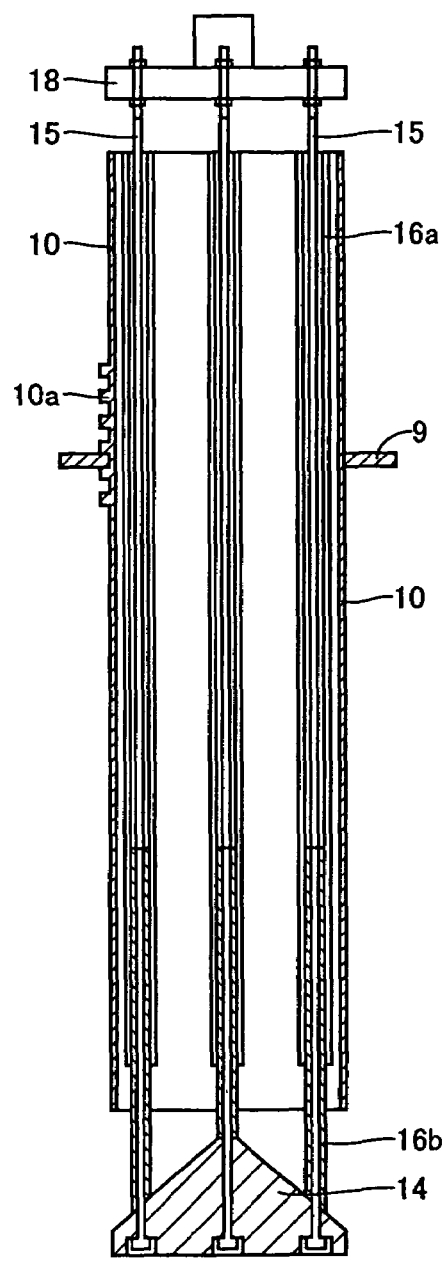
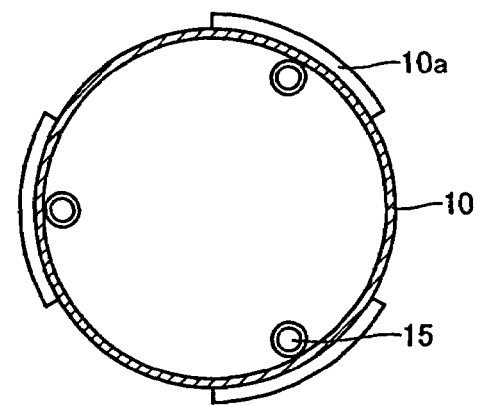
FIG. 4C
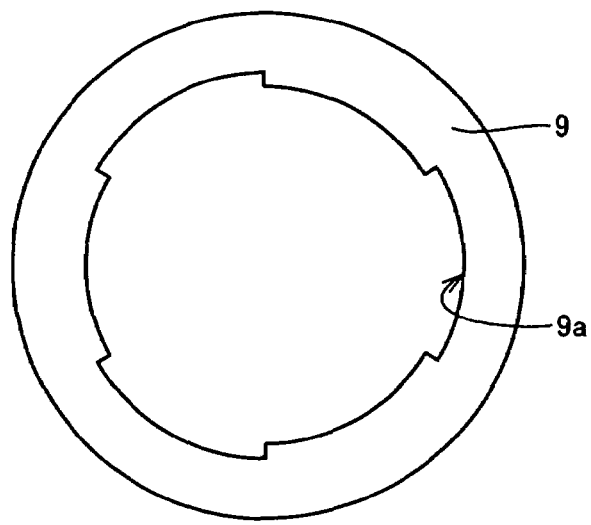

APPARATUS AND METHOD FOR SUPPLYING RAW MATERIAL IN CZOCHRALSKI METHOD

BACKGROUND OF THE INVENTION

1. Field of the Invention

The present invention relates to an apparatus for supplying raw material which is to be used in growing a single crystal by the Czochralski method (referred to as CZ method hereinafter), and to a method of supplying raw material which is to be employed in said apparatus. More particularly, it relates to an apparatus for supplying raw material which is to be used for additional charging or recharging of solid raw material to the molten raw material in a crucible in growing a silicon single crystal, and to a method of supplying raw material which is to be employed in said apparatus.

2. Description of the Related Art

Generally, in growing silicon single crystals by the CZ method, the solid polycrystalline silicon charged into a crucible as the initial charge is heated and melted by a heater surrounding the crucible. After formation of molten raw material in the crucible, a seed crystal held above the crucible is lowered until it is soaked into the molten raw material in the crucible, while the crucible is rotated in a fixed direction. The seed crystal is then pulled while it is rotated in a given direction, whereby a cylindrical silicon single crystal is thus grown underneath the seed crystal.

The solid raw material to be charged into the crucible as the initial charge is polycrystalline silicon in various forms, such as rod-like, lump-like or a granular form, which is supplied alone or in combination with each other, and serves to constitute the molten raw material for silicon single crystal growing.

In silicon single crystal growing by foregoing CZ method, when the solid raw material initially charged into the crucible melts down, the volume decreases, resulting in deficiency of molten raw material relative to the crucible volume capacity. If single crystal growing is carried out in such a condition, a decrease in productivity is unavoidable due to the insufficient quantity of the molten raw material.

For avoiding the decrease in productivity due to the above, it becomes necessary to secure a desired amount of the molten raw material by replenishing the deficiency of molten raw material. Thus, "additional charging" is carried out as a technique for additionally supplying the solid material after initial charging into the crucible.

Namely, this "additional charging" is a technique for increasing the amount of the molten raw material in the crucible by further adding the solid material to the molten raw material after melting the solid material initially charged in the crucible. By applying this "additional charging", it becomes possible to efficiently make most of the crucible volume capacity to be used and thereby improve the productivity in silicon single crystal growing.

Further, in growing silicon single crystals by the CZ method, a solid raw material supplying technique called "recharging" is also employed. More specifically, this is a technique adding the solid material in an amount corresponding to the decrease of the molten raw material incurred by pulling a first single crystal, into the molten raw material remaining in the crucible after pulling and growing said single crystal.

In other words, the technique is perceived that, applying "recharging", the quantity of molten raw material in the crucible can be maintained to the predetermined level, which makes it possible to repeatedly pull a single crystal, thus enabling the increase of the number of crystals to be pulled per crucible.

Therefore, by employing "recharging", it becomes possible to attain cost reduction through efficient utilization of the crucible and to improve the productivity and thereby reduce the cost of growing silicon single crystals, similarly to foregoing "additional charging".

However, the material supply by additional charging or recharging is made in the art by adding the solid material in granular form to the molten raw material in the crucible using a raw material supply device, which is inserted in the pulling/growing furnace. Therefore, it becomes more of an issue that the solid material additionally charged may damage the crucible or cause splashing of the molten raw material, the splash of which may adhere to the machinery parts in the crucible, resulting in shortening the life thereof or adversely affect the process of single crystal growing.

In this regard, various proposals concerning additional charging or recharging have been made in the art. For example, in view of the fact that the quartz crucible is readily damaged on the occasion of recharging and this may readily cause dislocation during single crystal growing, Japanese Patent Application Publication No. 09-208368 proposes a method of supplying silicon materials by which silicon materials can be additionally supplied in a manner friendly to both the silicon melt surface and solidified surface, rapidly and without damaging the quartz crucible on the occasion of melting.

It is alleged that when the method proposed in the above-cited Publication No. 09-208368 is adopted, the splashing of the molten raw material can be avoided and the productivity in silicon single crystal growing and the production yield can be improved.

Furthermore, since uncharacterized simple supply of the solid material directly to the material in the crucible causes splashing of the melt, a technology is employed which comprises the steps of solidifying the melt surface to some extent after pulling a single crystal as intended, feeding subsequently the solid raw material onto the solidified surface, and resuming melting said solidified surface as well as said solid raw material. In this case, it is necessary for the operator to visually monitor the state of solidification of the melt surface. During such monitoring, the operator cannot conduct any other work, which will be a hindrance to productivity improvement.

Therefore, for alleviating such operator's constraints and making it possible to strive for improvement in productivity, Japanese Patent Application Publication No. 11-236290 proposes a raw-material-additional-charging system for use in single crystal pulling apparatus, wherein the state of solidification of the melt surface is detected by means of a visual sensor. This raw-material-additional-charging system will make it possible to lighten operator's workload and allow the operator to conduct some other work and thereby improve the productivity.

Also, in republished WO2002/068732, since it may occur to damage the quartz crucible depending on the extent of solidification of the molten surface, which may result in peeling off the inner surface of the quartz crucible and then generating dislocation in the silicon single crystal, or may result in cracking of the quartz crucible and then generating the leakage of the molten raw material to the outside, a recharge pipe is proposed, wherein it can be easily put in place or retrieved from the single crystal pulling apparatus, and it enables the raw solid material to be directly supplied onto the solidified surface of the molten raw material in the crucible. By using this recharge pipe, a single crystal free from dislocation can be safely and efficiently produced.

SUMMARY OF THE INVENTION

In pulling a silicon single crystal, when an additional charging or recharging of a solid raw material in granular form is applied onto the molten raw material in the crucible, it becomes an important technical challenge that a raw-material-supplying apparatus shall be aligned with the centerline of the crucible in the pulling apparatus, and the solid raw material must be fed in uniform circumferential distribution to the molten raw material in the crucible.

Besides, depending on the internal structure of the raw-material-supplying apparatus, when the metallic component should directly contact with the solid raw material to be contained therein, there is a risk of mixing impurities into the solid raw material, thus likely resulting in the contamination of the grown single crystal.

Having regard to prior methods for supplying silicon raw material, prior raw-material-additional-charging systems, and a recharge pipe which have been proposed, a supply of the solid raw material in uniform circumferential distribution is not fully addressed, so that the supply amount of the solid raw material at a time is limited and thus it takes long time to complete supplying the raw material, whereby the working efficiency in growing a silicon single crystal is notably worsened.

Also, in a recharge pipe and the like which have been proposed so far, an issue concerning the impurities contamination to the solid raw material is not addressed, so that there should arise the problem that a silicon single crystal grown by applying an additional charging or recharging is likely to be contaminated.

In view of the state of the art as discussed above, it is an object of the present invention to provide an apparatus for supplying raw material in the CZ method and a method of supplying raw material to be employed in operating said apparatus, wherein, when an additional charging or recharging of solid raw material in granular form is applied, the solid raw material free from causing crystal contamination can be supplied in uniform circumferential distribution and can be supplied in abundance, thus enabling the achievement of efficient operation of the raw material supply.

The present inventors, to accomplish the above object, have investigated the raw material supply system which can be adapted to the CZ method. First, in order to supply the solid raw material in uniform circumferential distribution, the inventors paid attention to the findings that the raw material supply tube with an aperture at the lower end as a raw material supply apparatus is adopted and the structure having a conical bottom lid onto the aperture at the lower end thereof, being capable of shutting down said aperture, is effective.

More specifically, in the state that a conical bottom lid is effected to shut down the aperture at the lower end, foregoing solid raw material is filled into said raw material supply tube, which is subsequently lifted and lowered to the predetermined height position above the crucible to be located in the centerline of the pulling furnace, and then said bottom lid is effected to open. Thus, the solid raw material in granular form contained in the raw material supply tube can be released and supplied to the molten raw material in the crucible in uniform circumferential distribution.

Foregoing manipulation makes it possible to lift and perpendicularly suspend said raw material supply tube, aligning with the centerline of the crucible in the pulling apparatus, and to supply the contained solid raw material into the crucible in uniform circumferential distribution, thus enabling to increase the supply amount at a time. Consequently, the charging ratio of the solid raw material to be supplied into the crucible through the raw material supply tube can be enhanced, thereby the efficient supply of the raw material can be achieved.

Regarding opening the bottom lid of the raw material supply tube, a metallic support member, which runs through the inside space of the tube and is connected to the conical bottom lid, is disposed and arranged to be manipulated accordingly. Meanwhile, since the direct contact between the solid raw material to be contained in the raw material supply tube and the metallic support member should likely cause the mixture of impurities into the solid raw material, the metallic support member must be protected by the sheath tube onto itself to avoid said direct contact.

Further, as the structural member to directly contact with the solid raw material to be contained within the raw material supply tube, the inner surface of said raw material supply tube and the conical bottom lid are listed besides the sheath tube to cover the metallic support member, and shall be preferably made of quartz which poses no threat of impurities contamination.

To secure the maximum supply amount at a time by configuring equipment details of the pulling apparatus and/or the grade along with size of in-furnace parts, the predetermined height position where the raw material supply tube be lowered to must be adjusted considering the pulling apparatus and/or in-furnace parts. In this regard, the engaging-component to stop the descending movement of the raw material supply tube is required, wherein the metallic flange can be applied in the apparatus for supplying raw material according to the present invention.

When the metallic flange is applied, as a first means for height position control, a metallic band is fastened around the straight portion of the raw material supply tube, and the position where the metallic band be fastened is adjusted while holding the upper and lower ends of the metallic flange by said metallic band, whereby the height position at which the descending movement of the raw material supply tube to be stopped is controlled.

Next, as a second means for height position control, a metallic flange is fixed onto a plurality of projected steps which are disposed circumferentially on the external wall surface of the raw material supply tube, whereby the height position for the descending movement of the raw material supply tube to be stopped is controlled.

Further, as a third means for height position control, a flanged portion is also fixed to the raw material supply tube itself and an alignment hole is disposed in said fixed flange in such a manner that the hole in the metallic flange is arranged in the same alignment with the hole in said fixed flange, and thus a long-length screw is inserted through the alignment hole so that the length of the long-length screw (the position of the nut) is controlled, whereby the height position for the descending movement of the raw material supply tube to be stopped is controlled.

The present invention is consummated based on the foregoing findings, and the gist is described in following (1)-(3) as for an apparatus for supplying raw material in the CZ method and in following (4) as for a method for supplying raw material in the CZ method.

(1) An apparatus for supplying raw material for use in growing a single crystal by the CZ method, which is applied for an additional charging or recharging of the solid raw material in granular form into the molten raw material in the crucible, the apparatus comprising: a raw material supply tube in cylindrical form to be filled with said solid raw material; a releasable conical bottom lid disposed at the lower end aperture of said raw material supply tube; a metallic support member which is covered with the sheath tube, runs through the inside space of said raw material supply tube to be connected with said bottom lid at the end, enabling said bottom lid to descend and enabling said raw material supply tube as well as said bottom lid to ascend; an engaging-component to make the descending movement of said raw material supply tube to come to a halt; and a pulling means which enables said raw material supply tube and bottom lid to ascend/descend in suspension by means of said metallic support member, wherein the lower end aperture of said raw material supply tube can be released to open and said solid raw material can be supplied into the molten raw material in the crucible.

(2) An apparatus for supplying raw material as described in (1), further comprising one or a plurality, namely two or more, of metallic support members which are disposed within the inside space of the raw material supply tube, wherein, in case that a single metallic support member is disposed, it is connected with said bottom lid at its center position, and in case that a plurality of metallic support members are disposed, those are preferably to be connected with said bottom lid at the circumferential positions apportioned equally. Further, it is preferable that means for ascending/descending the raw material supply tube is disposed so as to synchronize with ascending/descending movement of said raw material supply tube by means of said metallic support member.

(3) An apparatus for supplying raw material as described in (1), wherein said sheath tube comprises a protective sheath tube for directly covering said metallic support member and a sliding sheath tube that is inserted so as to enable the sliding movement of said protective sheath tube. Further, said engaging-component can comprise a metallic flange disposed onto said raw material supply tube, wherein the position where to be disposed can be adjusted according to the pulling apparatus to be employed.

(4) A method for supplying raw material to be employed in growing a single crystal by the CZ method, which is applied for an additional charging or recharging the solid raw material in granular form into the molten raw material in the crucible, comprising the steps of: filling said solid raw material into a raw material supply tube having a conical bottom lid in place set to close the lower end aperture thereof lifting and descending said raw material subsequently above the crucible, which is disposed in the centerline of the pulling furnace: making the descending movement to come to a halt at the predetermined height; lowering down further a metallic support member, which is covered with a sheath tube and runs through the inside space of said raw material supply tube until being connected with said bottom lid; and releasing said bottom lid to open up the lower end aperture of said raw material supply tube, thereby enabling said solid raw material to be charged into the molten raw material in said crucible.

"Solid raw material in granular form" defined by the present invention is not necessarily limited to polycrystalline silicon in granular form, but can include polycrystalline silicon in rod-like form, powder-like form or the like. Nonetheless, it is preferable to use the solid raw material in the granular form since it is inexpensive and there is no risk of crack generation due to rapid heating. In this regard, it is more preferable that polycrystalline silicon raw material in granular form with 5 mm to 45 mm in granular diameter is used.

Further, "metallic support member" defined by the present invention can be exemplified by "metallic shaft" or "metallic wire" to serve for driving ascending and descending movement of a raw material supply tube as well as a bottom lid. Either can be used to meet the object of the present invention, but it is preferable to use "metallic shaft" from the view points of stable and reliable movement in descending and ascending the raw material supply tube and operability of the bottom lid. Thus, "metallic support member" is limited to "metallic shaft" and will be recited hereinafter.

According to the apparatus and method for supplying raw material by the present invention in CZ method, the raw material supply tube can be lifted and suspended perpendicularly in alignment with the centerline of the crucible in the pulling apparatus, thus resulting in supplying the contained solid raw material into the crucible in uniform circumferential distribution, whereby it becomes possible to increase the supply amount at a time leading up to enhance the charging ratio of the solid raw material to be supplied into the molten raw material in the crucible through the raw material supply tube, and to achieve efficient operation of raw material supply.

Further, the metallic shaft, the raw material supply tube, the conical bottom lid and the like, which directly should contact with the solid raw material to be contained in said raw material supply tube, can be protected with a sheath tube and/or can be made of structural material that poses no threat of impurity contamination, thus enabling the single crystal contamination to be avoided.

Accordingly, when an additional charging or recharging into the molten raw material in the crucible within the pulling furnace is applied, the solid raw material free from crystal contamination can be charged in uniform circumferential distribution and in large quantity, thus resulting in achieving efficient operation of raw material supply.

BRIEF DESCRIPTION OF THE DRAWINGS

FIGS. 2A and 2B each shows a first configuration example of a raw material supply tube for use in the apparatus for supplying raw material by the present invention, wherein FIG. 2A shows a configuration example with a front view in section and FIG. 2B does it with a plan view in section seen from above field.

FIGS. 4A-4C each shows a second configuration example of the raw material supply tube for use in the apparatus for supplying raw material by the present invention, wherein FIG. 4A shows a configuration example in a sectional front view, FIG. 4B does it in a plan view seen from above field and FIG. 4C is a diagram showing a plan view of a configuration example of a metallic flange.

FIGS. 5A and 5B each shows a main part of a third configuration example of the raw material supply tube for use in the apparatus for supplying raw material by the present invention, wherein FIG. 5A shows the state when the descending movement of said raw material supply tube comes to a halt, while FIG. 5B shows the state when the metallic shaft subsequently is lowered to release the bottom lid for opening.

DETAILED DESCRIPTION OF THE PREFERRED EMBODIMENTS

In the following, preferred embodiments of the apparatus for supplying raw material by the present invention are described by classifying into a first through third configuration example with reference to the accompanying drawings.

Figure 1:
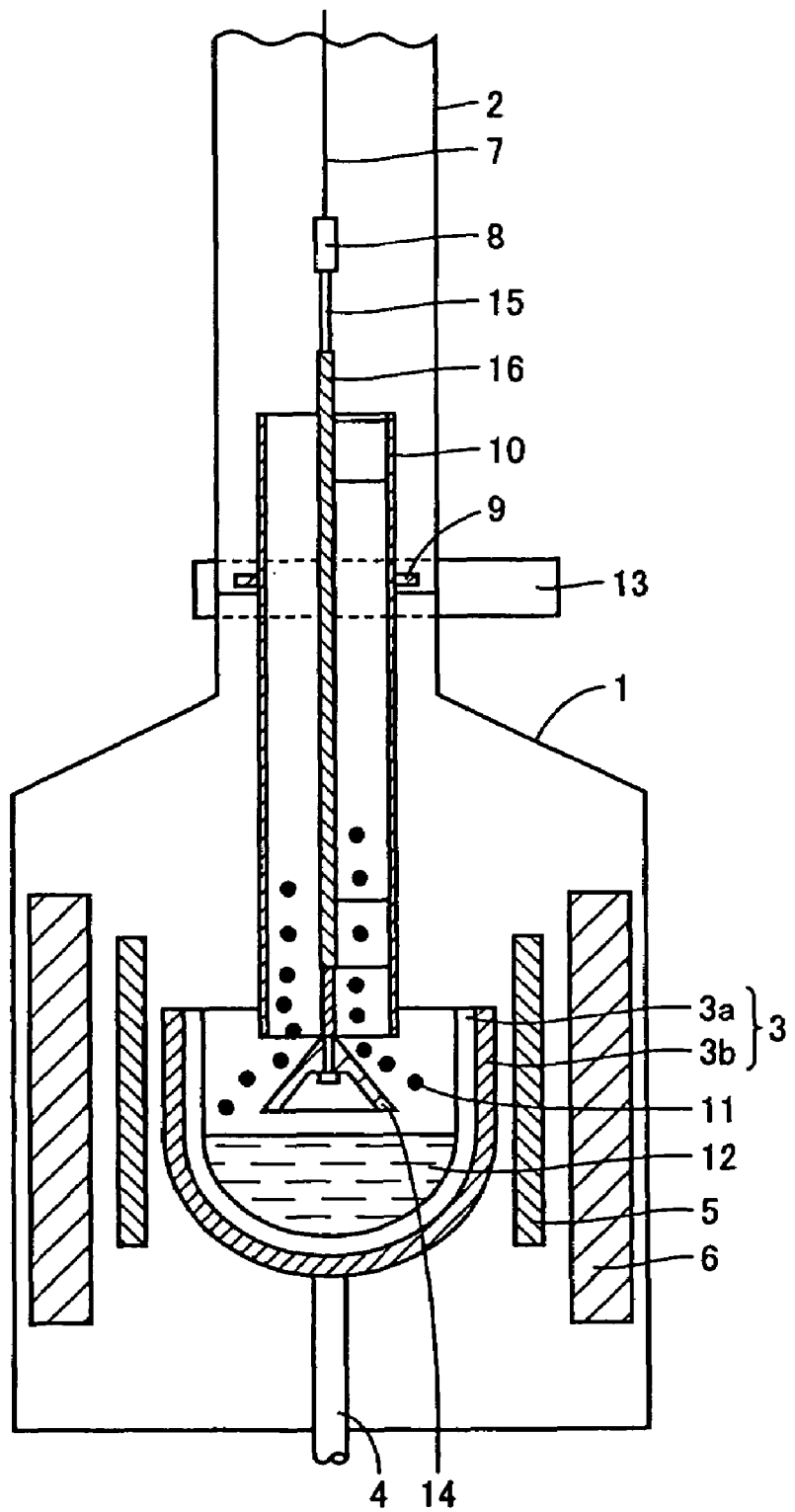
FIG. 1 is a section view illustrating the overall structure of a single crystal pulling furnace with an apparatus for supplying raw material by the present invention disposed therein.

FIG. 1 is a sectional view illustrating the overall structure of a single crystal pulling furnace with an apparatus for supplying raw material by the present invention disposed therein, which delineates the state that the solid raw material is charged into the molten raw material in the crucible. As shown in the diagram, the pulling furnace in the CZ method comprises a main chamber 1, a pull chamber 2 and further a gate valve 13. The pull chamber 2 is constituted by a cylindrical part which is smaller than the main chamber 1, and is disposed in alignment with the same centerline of the main chamber 1 in the upper area being intervened with the gate valve.

The gate valve 13 is disposed for enabling the inside space of the main chamber 1 to communicate with the inside space of the pull chamber 2 or to shut down the communication with each other, wherein the diameter of the communicating aperture is smaller than the pull chamber 2.

In the central zone of the main chamber, the crucible 3 lies. The crucible 3 comprises the dual structure where an inner quartz crucible 3a and an outer graphite crucible 3b are combined, and sits on the supporting shaft 4 called a pedestal having a crucible holder (not shown) in-between. The supporting shaft 4 is driven so as to ascend/descend the crucible 3 along the axial direction or to rotate it circumferentially.

The heater 5 is disposed so as to surround the crucible 3. The insulator 6 is disposed further outside the heater 5, being in parallel to the internal surface of the main chamber 1. The solid raw material that is charged into the crucible 3 as an initial charge is heated and melted by the heater 5 to be the molten raw material 12. After melting the solid raw material that is initially charged, an additional charging is carried out to replenish the deficiency of the molten raw material 12 and to secure the desired amount of the molten raw material in the crucible.

To that end, a pulling shaft 7 is perpendicularly hung within the pull chamber 2 and a raw material supply tube 10 for use in the apparatus for supplying raw material by the present invention is also hung. In this regard, the raw material supply tube 10 filled with the solid raw material 11 is disposed above the crucible 3 that contains the formed molten raw material 12, being intervened with the suspension jig 8 that is connected with the lower end of the pulling shaft 7. The pulling shaft 7 is driven by the driving mechanism that lies at the uppermost zone in the pulling chamber, not shown, to make the rotational movement and ascending/descending movement.

(A First Configuration Example of an Apparatus for Supplying Raw Material)

Figure 2A:
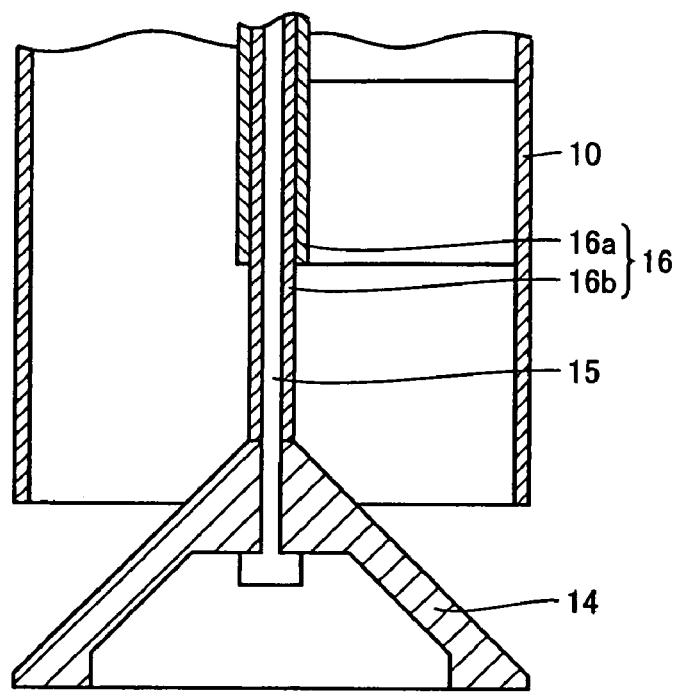
Figure 2B:
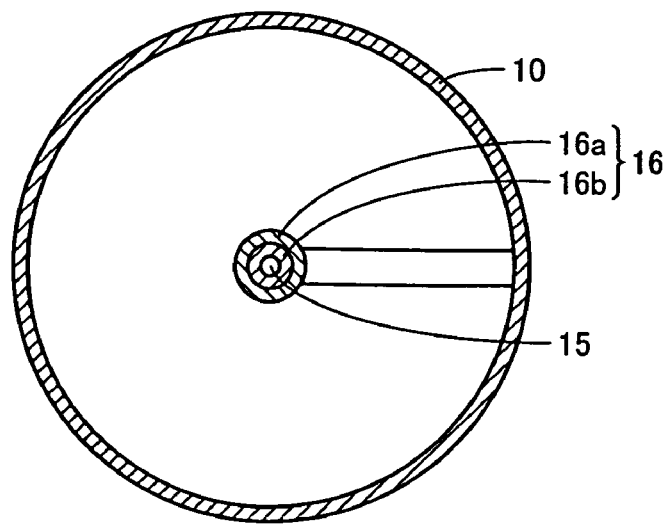

FIGS. 2A and 2B each shows a first configuration example of a raw material supply tube for use in the apparatus for supplying raw material by the present invention, wherein FIG. 2A shows a configuration example with a front view in section and FIG. 2B does it with a plan view in section seen from above field. As shown in FIG. 2A, in a first configuration example of the raw material supply tube, in order to fill the solid raw material into the inside space of the raw material supply tube 10, a conical bottom lid 14 is disposed at the lower end aperture of the raw material supply tube 10 so as to be releasable and is connected with a metallic shaft 15 that runs down through the inside space of the raw material supply tube 10 from the upper side.

Further, the metallic shaft 15 that runs down through the inside space of the raw material supply tube 10 is protected with a sheath tube 16 in order to avoid the direct contact with the solid raw material. The sheath tube 16 shown in FIG. 2A comprises a protective sheath tube 16b to directly cover said metallic shaft 15 and a sliding sheath tube 16a that is put in place so as to enable the protective sheath tube 16b to slide. The sheath tube 16 shown in FIG. 2A is configured not only for preventing the metallic shaft 15 from directly contacting with the solid raw material but also for securing a stable and reliable motion of the metallic shaft 15 free from generating the off-center misplacement.

In the structure of the raw material supply tube 10 shown in FIGS. 2A and 2B, foregoing sliding sheath tube 16a is fixed into the inside surface of the raw material supply tube 10 so as to be aligned in the centerline of the raw material supply tube 10 and to lie perpendicularly. Therefore, the metallic shaft 15 that runs through the bore of the raw material supply tube 10 is not only freed from contaminating the solid raw material owing to the protective sheath tube 16b that directly covers itself but also freed from being off-center with respect to the raw material supply tube 10.

Thus, it becomes possible for the metallic shaft 16 to perpendicularly suspend the raw material supply tube 10 in alignment with the centerline of the crucible, which enables supplying the solid raw material into the molten raw material in the crucible in uniform circumferential distribution.

Figure 3:
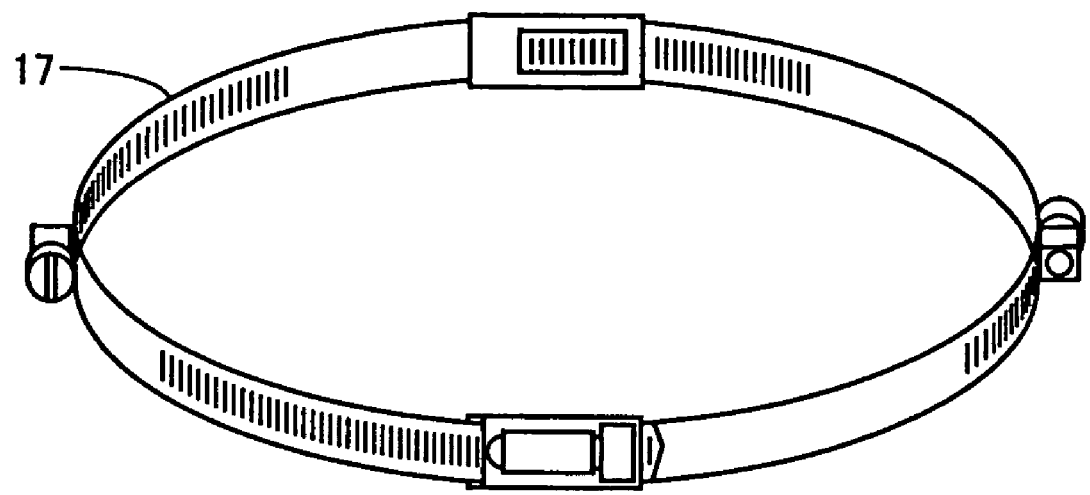
FIG. 3 is a perspective view in appearance of a metallic band which is used to hold both ends of a metallic flange in case the metallic flange is used as an engaging-component.

FIG. 3 is a perspective view in appearance of a metallic band which is used to hold both ends of a metallic flange in case the metallic flange is used as an engaging-component. In the apparatus for supplying raw material shown in foregoing FIG. 1, the metallic flange 9 is used as an engaging-component. Herein, the straight portion of the raw material supply tube 10 is fastened by a metallic band 17 and the height position where the raw material supply tube 10 descends and comes to a halt can be adjusted and controlled by adjusting the position to be fastened with said metallic band 17 while holding the upper and lower ends of the metallic flange 9 by said metallic band 17.

With reference to foregoing FIG. 1, FIGS. 2A and 2B, the procedure of an additional charging is recited in the followings. After melting the solid raw material that is initially charged into the crucible 3, the raw material supply tube 10 filled with the solid raw material 11 is transferred, by means of an interconnecting suspension jig 8 that is connected with the lower end of the pulling shaft 7, above the crucible 3 that contains the formed molten raw material. The molten raw material 12 in the crucible 3 is insufficient relative to the cavity volume of the crucible because the solid raw material that is initially charged into the crucible 3 is physically limited with respect to the cavity volume of the crucible.

When the melting of the solid raw material that is initially charged in the crucible 3 is nearly completed and the remaining solid raw material appears to be an isolated island, as shown in foregoing FIG. 1, the raw material supply tube 10 is lowered and the metallic flange 9 makes physical contact with the predetermined position zone, for instance, the smaller diameter zone where the gate valve 13 is disposed, thus enabling only the raw material supply tube 10 to come to a halt.

Meanwhile, since the conical bottom lid 14 that is connected with the metallic shaft 15 is free and can be lowered, the bottom lid 14 is released to be opened when the pulling shaft 7 is further lowered from foregoing position, thus enabling the solid raw material 11 in granular form within the raw material supply tube 10 to drop due to its tare weight and to be supplied to the molten raw material 12.

In this regard, as shown in FIGS. 2A and 2B, as the metallic shaft 15 that runs through the raw material supply tube is protected by a sliding sheath tube 16a, that is fixed to the inside surface of the raw material supply tube 10, and a protective sheath tube 16b, that directly covers the metallic shaft and is inserted into said sliding sheath tube 16a, the contamination of the solid raw material can be avoided, and the off-center movement of the metallic shaft can be eliminated, thus enabling the solid raw material 11 to be supplied in uniform circumferential distribution.

When the charging of the solid raw material 11 is completed, the raw material supply tube 10 is raised upward, and brought outside the pull chamber 2. If the amount of the molten raw material in the crucible 3 should not come to the desired level yet, the other raw material supply tube 10 set aside is applied, thus repeating the charging of the solid raw material 11.

When an additional charging is completed and the amount of the molten raw material in the crucible 3 comes to the desired level, the suspension jig 8 that is connected with the lower end of the pulling shaft 7 is connected with the seed crystal instead and advances to the growing step of a single crystal.

In the foregoing, the procedure of an additional charging is recited. And recharging can be made by the similar procedure after a first single crystal is grown such that the solid raw material 11 in an amount corresponding to the decrease of the molten raw material is charged into the remaining molten raw material 12 in the crucible 3.

(A Second Configuration Example of an Apparatus for Supplying Raw Material)

FIGS. 4A-4C each shows a second configuration example of a raw material supply tube for use in the apparatus for supplying raw material by the present invention, wherein FIG. 4A shows a configuration example in a sectional front view and FIG. 4B does it in a plan view seen from above field. Further, FIG. 4C is a diagram showing a plan view of a configuration example of a metallic flange as described in the followings.

In the apparatus for supplying raw material by the present invention, a cylindrical raw material supply tube 10 filled with the solid raw material is disposed onto a conical bottom lid 14 that is connected with the metallic shaft 15. In this regard, when the raw material supply tube becomes larger in diameter and longer, it becomes difficult to maintain the raw material supply tube 10 in perpendicular manner, thus resulting in likely failure of the main body of the raw material supply tube or the sheath tube 16.

Therefore, it is preferable that the apparatus for supplying raw material by the present invention is configured to have a plurality of the metal shafts 15 that is two or more within the raw material supply tube 10 and to be connected with the bottom lid 14 at the circumferential positions that are equally apportioned. Since the load due to suspending the raw material supply tube 10 can be dispersed well in balance, the raw material supply tube 10 can be always hung in perpendicular manner, thus enabling the solid raw material to be supplied into the crucible in uniform circumferential distribution.

The apparatus shown in FIG. 4A is configured to be disposed with three metallic shafts 15 within the raw material supply tube 10 and to be connected with the conical bottom lid 14 at three circumferential positions that are equally apportioned. Each metallic shaft 15 is protected by a couple of the sheath tube 16a, 16b respectively. It is preferable that, when a plurality of metallic shafts, that is two or more, are disposed, a dedicated hanger 18 is provided so as to lift up each metallic shaft 15 well in balance.

FIG. 4C is a diagram showing a plan view of a configuration example of a metallic flange to be used for the apparatus for supplying raw material. As shown in FIG. 4B, a plurality of projected steps 10a are disposed in three circumferential directions onto the outer surface of the raw material supply tube 10, wherein the groove 9a exactly matching with the projected step 10a in section is disposed onto the inside surface in the metallic flange, and wherein the position to be engaged is adjusted while rotating the metallic flange 9, thus enabling the metallic flange 9 to be engaged and to adjust and control the height position where the raw material supply tube 10 comes to a halt.

(A Third Configuration Example of an Apparatus for Supplying Raw Material)

Figure 5A:
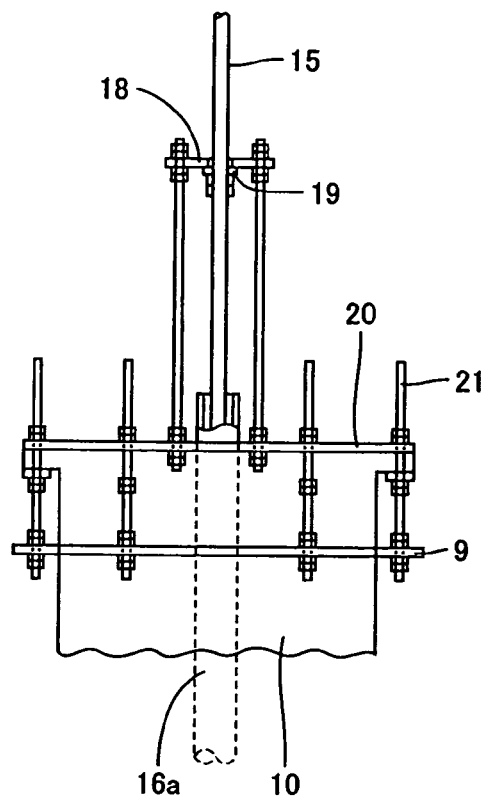
Figure 5B:
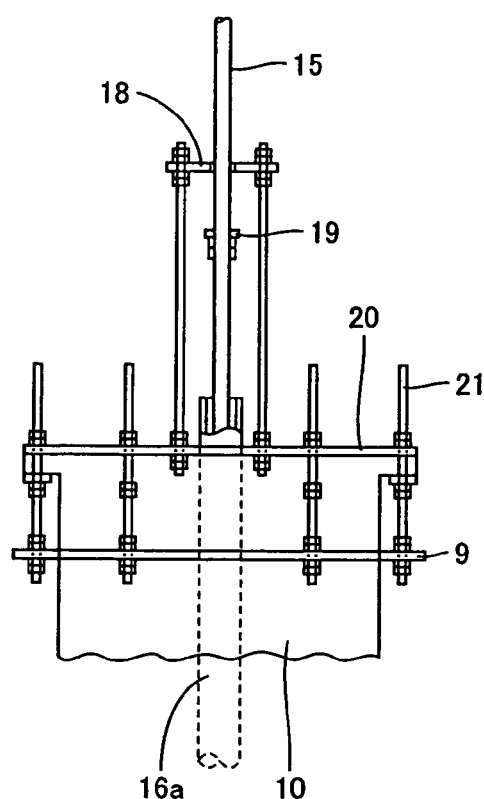

FIGS. 5A and 5B each shows a main part of a third configuration example of the raw material supply tube for use in the apparatus for supplying raw material by the present invention, wherein FIG. 5A shows the state when the descending movement of said raw material supply tube comes to a halt, while FIG. 5B shows the state when the metallic shaft subsequently is lowered to release the bottom lid for opening.

The apparatus for supplying raw material shown in FIGS. 5A and 5B is configured to have means for ascending/descending in the raw material supply tube 10 also so as to enable synchronizing the ascending/descending movement of the metallic shaft 15, wherein the timing that the raw material supply tube 10 is lifted up by putting in place the conical bottom lid 14 to the lower end aperture thereof is synchronized with the timing of lift up by means of ascending/descending mechanism disposed in the raw material supply tube 10 itself. By synchronizing the timing of ascending/descending movement, not only the ascending/descending movement of the metallic shaft 15 but also that of the raw material supply tube 10 can be further stabilized.

Specifically, as a means for driving ascending/descending movement of the raw material supply tube 10, in the apparatus for supplying raw material shown in FIGS. 5A and 5B, a metallic (stainless steel etc.) washer 19 is disposed onto the metallic shaft 15. It is configured that the raw material supply tube 10 has the sheath tube 16a in alignment with the centerline thereof, wherein the metallic shaft 15 can ascend/descend inside the sheath tube, and the metallic washer 19 is disposed at the predetermined height position of the metallic shaft 15. Further, a dedicated hanger 18 equipped for suspending the raw material supply tube 10 in balance will provide an ascending/descending engagement for the metallic washer 19.

In order to coincide the timing of the closing of the conical bottom lid, culminating to raise the raw material supply tube, with the timing of the start of ascending movement of the raw material supply tube, the height position where the metallic washer 19 is disposed can be adjusted, whereby the timing of ascending/descending movement can be synchronized. Thus, the ascending/descending movement of the raw material supply tube can be further stabilized in tune with ascending/descending movement of the metallic shaft 15.

Figure 6:
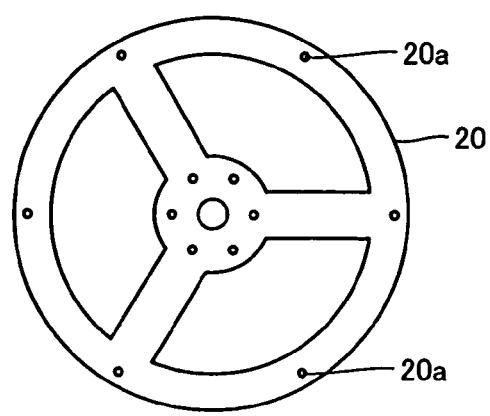
FIG. 6 shows a plan view of the configuration of the metallic upper member which is used for the raw material supply tube (a third configuration example) shown in foregoing FIGS. 5A and 5B.

FIG. 6 shows a plan view of the configuration of the metallic upper member which is used for the raw material supply tube (a third configuration example) shown in foregoing FIGS. 5A and 5B. The metallic upper member 20 is made of metal such as stainless steel and disposed onto the uppermost portion of the raw material supply tube 10.

Besides, the metallic flange 9 that is used in a third configuration example is configured to be fixed onto the metallic upper member 20 of the raw material supply tube 10 by fastening the nut engaged to the long-length screw 21 that is fitted into the alignment hole 20a, being disposed at the predetermined circumferential position of said metallic upper member 20. In this regard, the height position of the metallic flange 9 can be adjusted by jacking the long-length screw 21.

EXAMPLES

In the followings, dimensional details about the raw material supply tube for use in the apparatus for supplying raw material by the present invention are specifically recited along with the method for supplying raw material by using the same with reference to FIGS, 1, 2A, 2B and 3.

In the pulling furnace shown in foregoing FIG. 1, the crucible 3 of 22 inch in diameter was used to grow a silicon single crystal of 8 inch in diameter. In growing step, the polycrystalline silicon of 100 kg in combination of rod-like, lump-like and granular form was charged into the crucible 3 as an initial charge to form the molten raw material 12, and an additional charge followed.

The raw material supply tube 10 is configured to have the metallic shaft 15 in alignment with the centerline and to hang the conical bottom lid 14 in alignment with the centerline by means of the metallic shaft 15. The metallic shaft 15 is directly protected by the sliding sheath tube 16a along with the protective sheath tube 16b.

The raw material supply tube 10 is made of quartz in cylindrical form, comprising 190 mm in bore diameter and 1000 mm in length. The sliding sheath tube 16a, being disposed in alignment with the centerline of the raw material supply tube 10, is made of quartz, comprising about 23 mm in bore diameter and similar length to that of said raw material supply tube. The sliding sheath tube 16a is fixed onto the inside surface of the raw material supply tube 10 by means of the plate-like arm made of quartz that is deposited onto the inside surface (at two locations: one at lower side, the other at upper side) of the raw material supply tube.

The protective sheath tube 16b is disposed inside the sliding sheath tube 16a, which is intended to directly protect the metallic shaft 15. The protective sheath tube 16b is made of quartz and comprises about 20 mm in diameter, about 13 mm in bore diameter, and about 300 mm in length.

The metallic band 17 (hose band made of stainless steel) is engaged to fasten the straight portion at the predetermined height position of the raw material supply tube 10 and to fix the metallic flange 9 onto the tube.

The conical bottom lid 14 is made of quartz and comprises the connection holes for providing a connection engagement with the metallic shaft 15. The metallic shaft 15 is made of either molybdenum or stainless, and protected by foregoing protective sheath tube 16b along with sliding sheath tube 16a, wherein the lower end of said shaft is fitted into the connection hole of foregoing conical bottom lid, and the upper end thereof is connected with the suspension jig 8 to be directly connected with the pulling shaft 7.

While the conical bottom lid 14 was put on to close the lower end aperture, the solid raw material weighing 20 kg in the granular form with 5-35 mm in diameter was filled into the inside space of the raw material supply tube 10.

When the melting of the solid raw material in the crucible 3 by an initial charge was nearly completed and the remaining solid raw material before melting appeared to be an isolated island, foregoing raw material supply tube 10 that had been filled with the solid raw material 11 was transferred in suspension above the crucible 3 in alignment with the centerline of the pulling furnace. Incidentally, the conical bottom lid 14 remained as being put on to close the aperture of the raw material supply tube 10 filled with the solid raw material 11.

Then, the raw material supply tube 10 descended in suspension and came to a halt by means of an engagement with the metallic flange 9, while the metallic shaft 15 continued to descend in amount of about 30-50 mm before taking off the conical bottom lid 14 for opening the lower aperture, thus resulting in providing the solid raw material 11 into the molten raw material 12 in the crucible 3.

Then, the solid raw material 11 in the granular form filled into the raw material supply tube 10 was charged into the molten raw material 12 in the crucible 3 in uniform circumferential distribution, and after that, the raw material supply tube 10 was raised and taken out of the pulling furnace. In charging operation of the solid raw material, the manipulation of the conical bottom lid 14 was smoothly carried out, and the solid raw material 11 was charged in uniform circumferential distribution to enhance the charging ratio, thereby enabling the efficient operation in supplying raw material.

Further, the solid raw material 11 charged into the crucible 3 was heated and melted exactly in the same manner with the initial charge operation, and any trouble such as contamination due to the metal structure did not arise at all.

What is claimed is:

1. An apparatus for supplying a raw material for use in growing a single crystal by the CZ method, which is applied for an additional charging or recharging the solid raw material in granular form into a molten raw material in the crucible, the apparatus comprising:

a raw material supply tube in cylindrical form to be filled with said solid raw material;

a releasable conical bottom lid disposed at the lower end aperture of said raw material supply tube;

a metallic support member which is covered with a sheath tube, runs through the inside space of said raw material supply tube to be connected with said bottom lid at the end, which enabling said bottom lid to descend and enabling said raw material supply tube as well as said bottom lid to ascend;

an engaging-component to make the descending movement of said raw material supply tube to come to a halt; and a pulling means which enables said raw material supply tube and bottom lid to ascend/descend in suspension by means of said metallic support member, wherein the lower end aperture of said raw material supply tube can be released to open and said solid raw material can be supplied into the molten raw material in the crucible.

2. An apparatus for supplying raw material according to claim 1, further comprising one or a plurality, namely two or more, of metallic support members which are disposed within the inside space of the raw material supply tube, wherein, in case that a single metallic support member alone is disposed, it is connected with said bottom lid at its center position, and in case that a plurality of metallic support members are disposed, those are connected with said bottom lid at its circumferential positions apportioned equally.

3. An apparatus for supplying raw material according to claim 2, wherein said sheath tube comprises a protective sheath tube for directly covering said metallic support member and a sliding sheath tube that is inserted so as to enable the sliding movement of said protective sheath tube.

4. An apparatus for supplying raw material according to claim 1, further comprising means for ascending/descending said raw material supply tube so as to synchronize with ascending/descending movement of said metallic support member intended for making said raw material supply tube to ascend/descend.

5. An apparatus for supplying raw material according to claim 4, wherein said sheath tube comprises a protective sheath tube for directly covering said metallic support member and a sliding sheath tube that is inserted so as to enable the sliding movement of said protective sheath tube.

6. An apparatus for supplying raw material according to claim 1, wherein said sheath tube comprises a protective sheath tube for directly covering said metallic support member and a sliding sheath tube that is inserted so as to enable the sliding movement of said protective sheath tube.

7. An apparatus for supplying raw material according to claim 1, wherein said engaging-component comprises a metallic flange to be disposed onto said raw material supply tube, and wherein the position where to be disposed can be adjusted according to the pulling apparatus to be employed.

8. A method for supplying raw material to be employed in growing a single crystal by the CZ method, which is applied for an additional charging or recharging the solid raw material in granular form into the molten raw material in the crucible, the method comprising the steps of:
    filling said solid raw material into a raw material supply tube having a conical bottom lid in place set to close the lower end aperture thereof;
    lifting and descending said raw material supply tube subsequently above the crucible, which is disposed in the centerline of the pulling furnace;
    making the descending movement of said raw material supply tube to come to a halt at the predetermined height;
    lowering down further a metallic support member, which is covered with a sheath tube and runs through the inside space of said raw material supply tube until being connected with said bottom lid; and
    releasing said bottom lid to open up the lower end aperture, thus enabling said solid raw material to be charged into said molten raw material in said crucible.

9. A method for supplying raw material according to claim 8, wherein one or a plurality, namely two or more, of metallic support members are disposed within the inside space of the raw material supply tube, and wherein, in case that a single metallic support member is disposed, it is connected with said bottom lid at its center position, while in case that a plurality of metallic support members are disposed, those are preferably to be connected with said bottom lid at the circumferential positions apportioned equally.

10. A method for supplying raw material according to claim 8, wherein an ascending/descending movement of said metallic support member is configured to synchronize with an ascending/descending movement of said raw material supply tube.

* * * * *